United States Patent [19]
Ahsuri

[11] Patent Number: 6,052,811
[45] Date of Patent: Apr. 18, 2000

[54] METHOD AND APPARATUS FOR LOCATING CRITICAL SPEED PATHS IN INTEGRATED CIRCUITS USING JTAG PROTOCOL

[75] Inventor: Roni Ahsuri, Yaakov, Israel

[73] Assignee: Intel Corporation, Santa Clara, Calif.

[21] Appl. No.: 08/838,092

[22] Filed: Apr. 15, 1997

[51] Int. Cl.[7] .................................................. G01R 31/28
[52] U.S. Cl. ........................................... 714/745; 714/724
[58] Field of Search ...................................... 714/745, 744, 714/735, 736, 727, 30, 724; 324/158.1; 326/21

[56] References Cited

U.S. PATENT DOCUMENTS

| | | | |
|---|---|---|---|
| 5,029,166 | 7/1991 | Jarwala et al. | 714/728 |
| 5,377,198 | 12/1994 | Simpson et al. | |
| 5,428,624 | 6/1995 | Blair et al. | 324/158.1 |
| 5,434,804 | 7/1995 | Bock et al. | 702/117 |
| 5,479,652 | 12/1995 | Dreyer et al. | 364/265.6 |
| 5,537,536 | 7/1996 | Groves | 364/232.8 |
| 5,596,734 | 1/1997 | Ferra | 710/5 |
| 5,598,421 | 1/1997 | Tran et al. | |
| 5,608,736 | 3/1997 | Bradford et al. | |
| 5,774,476 | 6/1998 | Pressly et al. | 714/726 |
| 5,805,608 | 9/1998 | Baeg et al. | 714/726 |

*Primary Examiner*—Albert De Cady
*Assistant Examiner*—Shelly A Chase
*Attorney, Agent, or Firm*—Blakely, Sokoloff, Taylor & Zafman LLP

[57] ABSTRACT

A method and apparatus for locating a critical speed path in an integrated circuit. The apparatus comprises a plurality of controllable clock drivers each coupled to a circuit block of the integrated circuit. The apparatus also comprises a plurality of clocked storage devices each coupled to one of the controllable clock drivers and including a clock input, a data input and a data output. Test circuitry that operates with joint test action group (JTAG) compatible protocol is coupled to the plurality of clocked storage devices and generates a signal that controls the plurality of controllable clock drivers.

9 Claims, 5 Drawing Sheets

FIG. 5

| Flip - Flop | Data Out $\phi$ | $\phi$+1 | $\phi$+2 | $\phi$+3 | $\phi$+4 | $\phi$+5 | $\phi$+6 | $\phi$+7 |
|---|---|---|---|---|---|---|---|---|
| FF1 | 0 | 0 | 0 | 0 | 1 | 1 | 1 | 1 |
| FF2 | 0 | 0 | 1 | 1 | 0 | 0 | 0 | 0 |
| FF3 | 0 | 1 | 1 | 1 | 1 | 1 | 1 | 1 |
| FF4 | 1 | 0 | 0 | 0 | 0 | 0 | 1 | 1 |
| FF5 | 0 | 1 | 1 | 1 | 1 | 0 | 0 | 0 |
| FF6 | 1 | 1 | 0 | 0 | 0 | 0 | 0 | 1 |
| FF7 | 1 | 1 | 1 | 1 | 0 | 0 | 1 | 1 |
| FF8 | 0 | 0 | 0 | 1 | 1 | 1 | 1 | 1 |
| FF9 | 1 | 1 | 0 | 0 | 1 | 1 | 1 | 0 |

→ Time

↑ Fault Occurs 6,052,811

METHOD AND APPARATUS FOR LOCATING CRITICAL SPEED PATHS IN INTEGRATED CIRCUITS USING JTAG PROTOCOL

FIELD OF THE INVENTION

The present invention is in the field of testing digital semiconductor electronic devices.

BACKGROUND OF THE INVENTION

Within every digital integrated circuit there is usually one data path between two circuit blocks that requires more time to propagate valid data than any other path between the circuit blocks. The data path that requires the longest time for the data signal to be propagated before it may be sampled is known as the critical speed path of the integrated circuit. Critical speed paths may be slow due, for example, to a greater number of device delays or greater signal travel distances.

The maximum speed at which the digital integrated circuit may operate is limited by the critical speed path in the digital integrated circuit. The reason for this is that the critical speed path presents the longest delay path and the clock rate cannot be increased beyond the point at which the clock cycle time is equal to the propagation delay of signals on the critical speed path.

Since the maximum speed of an integrated circuit is limited by the critical speed path of the integrated circuit, design of an efficient circuit is facilitated by location of the critical speed path. However, in complex modern integrated circuits such as microprocessors there are millions of possible critical speed paths. To locate the critical speed path among the millions of data paths in the integrated circuit, sophisticated design and testing tools are required.

SUMMARY OF THE INVENTION

A method and apparatus for locating a critical speed path in an integrated circuit using a joint test action group (JTAG) compatible protocol is described. The apparatus comprises a plurality of controllable clock drivers each coupled to a circuit block of the integrated circuit. The apparatus also comprises a plurality of clocked storage devices each coupled to one of the controllable clock drivers and including a clock input, a data input and a data output. Test circuitry that operates with joint test action group (JTAG) compatible protocol is coupled to the plurality of clocked storage devices and generates a signal that controls the plurality of controllable clock drivers.

In one embodiment, the controllable clock driver comprises a capacitor coupled to the clock signal. In another embodiment, the controllable clock driver circuit comprises a circuit that introduces contention on the clock signal line.

BRIEF DESCRIPTION OF THE DRAWINGS

FIG. 5 is an example of data obtained from a logic simulation of the VLSI circuit.

DETAILED DESCRIPTION

In the following detailed description of the present invention numerous specific details are set forth in order to provide a thorough understanding of the present invention. However, it will be obvious to one skilled in the art that the present invention may be practiced without these specific details. In other instances well known methods, procedures, components, and circuits have not been described in detail to avoid unnecessarily obscuring the present invention.

Figure 1:
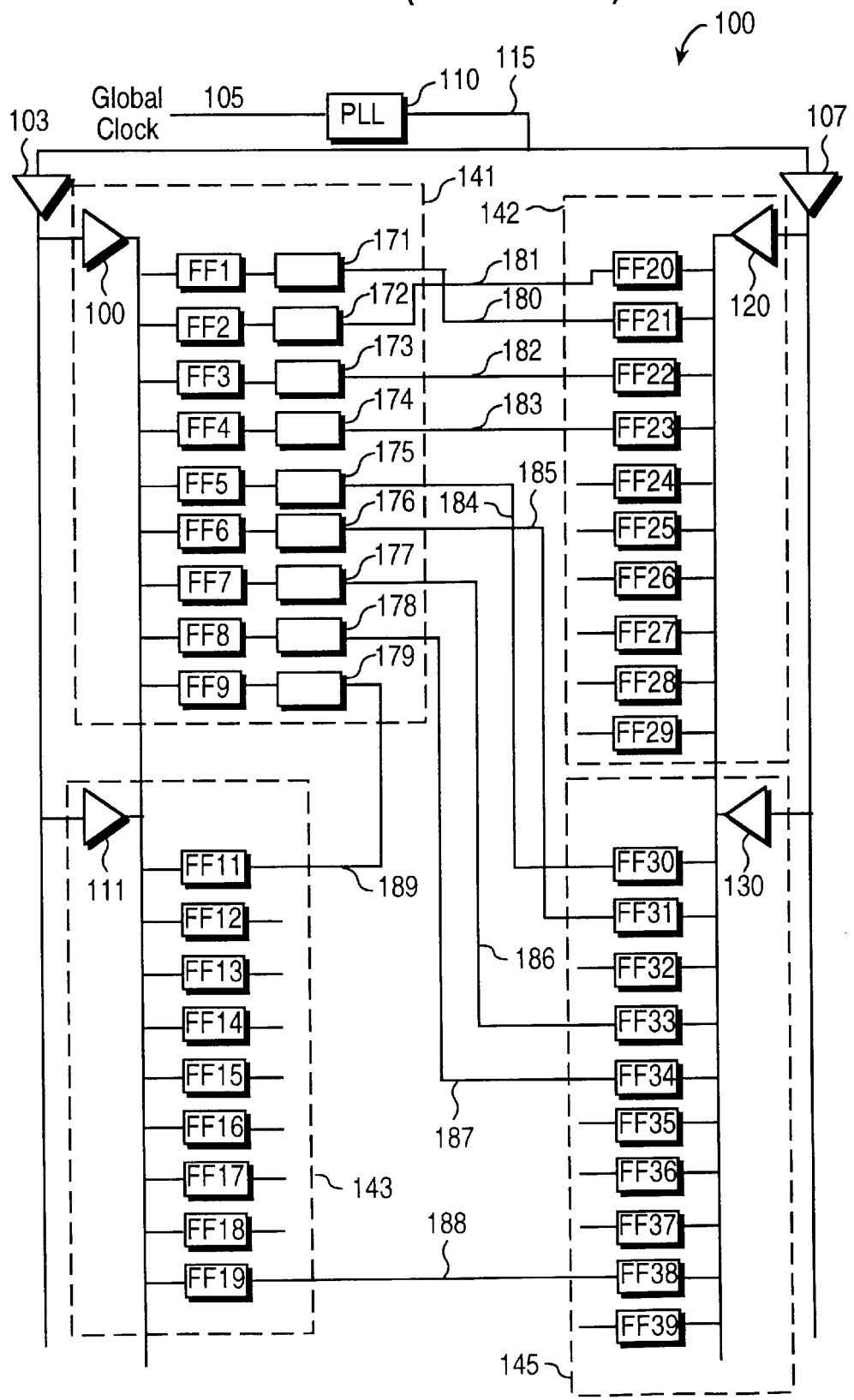
FIG. 1 is a block diagram of a prior art highly integrated digital integrated circuit.

FIG. 1 is a block diagram of part of a prior art VLSI circuit 100. An external, global clock signal driven by a crystal or other means is introduced into the integrated circuit on external clock line 105. External clock line 105 enters a phase lock loop circuit 110 or other clock generator that drives main clock signal line 115 within the integrated circuit.

The digital integrated circuit of FIG. 1 is divided into several circuit subblocks. Each circuit subblock provides some functionality for the integrated circuit. Main clock signal line 115 is distributed to subblock clock drivers 103 and 107 that drive the clock signal within the various circuit subblocks. Subblock clock drivers 103 and 107 strengthen the clock line signal in order to drive a large fan-out of local circuits within each subblock.

Within each subblock are several subcircuits, or local block circuits (141, 142, 143, and 145). The strengthened clock line is supplied to local clock driver 100, 120, 111, and 130 within each local block (141, 142, 143, and 145 respectively). Each local clock driver drives a clock signal for the circuits within its local block circuit.

Each local block circuit comprises circuitry including storage elements such as flip-flops and discrete portions of logic circuitry. For example, local block circuit 141 includes flip-flops FF1 through FF9 and logic circuitry 171 through 178. Local block circuit 142 includes flip-flops FF20 through FF29. Local block circuit 143 includes flip-flops FF11 through FF19. Local block circuit 145 includes flip-flops FF30 through FF39. Logic circuitry of each of local block circuits 142, 143, and 145 is not shown for clarity.

Within a digital integrated circuit, data is often shared between logic circuits in various circuit subblocks via defined data paths. For example, in FIG. 1, data paths 180 through 183 carry data from logic circuits in local block circuit 141 to local block circuit 142. Data paths 184–187 carry data from local block circuit 141 to local block circuit 145. Data path 189 carries data from local block circuit 141 to local block circuit 143. Data path 188 carries data from local block circuit 143 to local block circuit 145.

Data transferred between local block circuits is output by the transmitting local block circuit and is received on the data input of a flip-flop in the receiving local block circuit. For example, data path 186 carries information from flip-flop 7 (FF7) to flip-flop 33 (FF33). If logic circuitry 177 between flip-flop 7 and flip-flop 33 is sufficiently complex, a long propagation delay is introduced causing the information that will be placed on data path 186 to be sampled before it is valid. If the speed of the clock driving the integrated circuit is increased beyond the propagation delay of the slowest data path, then the receiving flip-flop samples the data before the data has propagated through the data path logic. In such a situation, the receiving flip-flop will sample invalid data.

Within a digital integrated circuit there is typically one data path between two circuit blocks that requires more time to propagate valid data than any other path. The data path that requires the longest time for the data signal to be propagated before it may be sampled is known as the critical speed path of the integrated circuit. The maximum speed at which the digital integrated circuit may operate is limited by the critical speed path. To improve the performance of a digital integrated circuit, a designer must first be able to locate the critical speed path and redesign the circuit.

Figure 2:
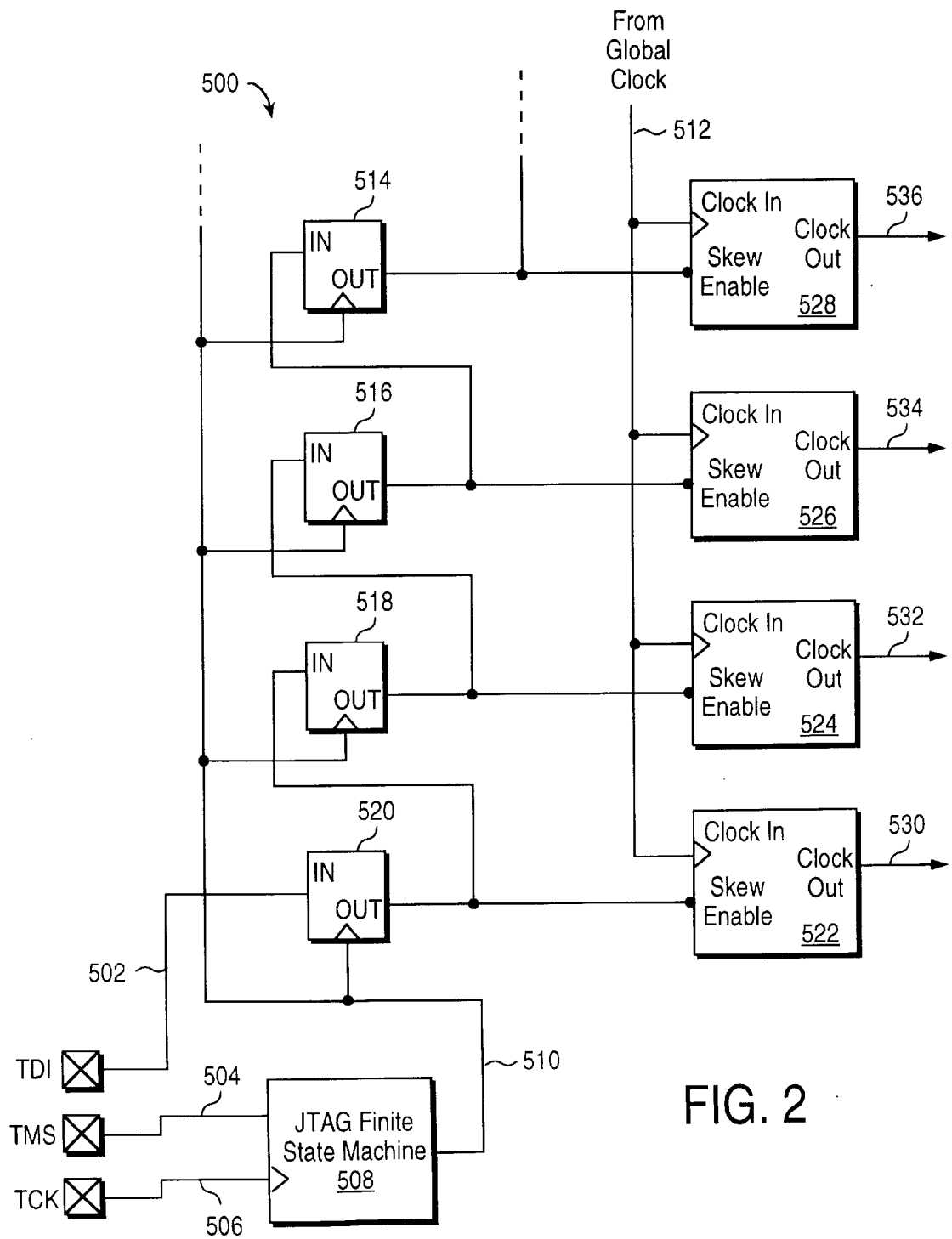
FIG. 2 is a block diagram of part of a very large scale integration (VLSI) circuit according to one embodiment of the present invention.

FIG. 2 is a block diagram of a portion of a VLSI circuit 500 according to an embodiment of the present invention. VLSI circuit 500 includes circuitry for locating critical speed paths using JTAG compatible protocols. VLSI circuit 500 includes local block controllable clock drivers 522, 524, 526, and 528. Each of these controllable clock drivers provide a clock signal to a local block circuit. Typically, VLSI circuit 500 includes more controllable clock drivers than are shown. Clock signals 530, 532, 534, and 536 each clock flip-flops in different local block circuits. Each controllable clock driver has a clock input that receives the global clock signal transmitted through a subblock clock driver. Each controllable clock driver also includes a skew enable input. An active signal on the skew enable input of a controllable clock driver delays the clock signal transmitted at the out put of the controllable clock driver.

Local block controllable clock drivers 522, 524, 526, and 528 are independently addressable on their respective skew enable inputs so that, according to the present invention, it is possible to more efficiently determine critical paths as will be explained more fully below.

JTAG finite state machine 508 is part of VLSI circuit 500. JTAG finite state machine 508 establishes an interface between the world external to VLSI circuit 500 and VLSI circuit 500. In this embodiment, this is accomplished using the serial interface described in the IEEE Standard 1149.1-1190 (IEEE Test Access Port and Boundary Scan Architecture). An objective of the Standard is to allow access to and control of integrated circuit elements for testing and other purposes by means of features that are built into the integrated circuits themselves.

VLSI circuit 500 comprises flip-flops 514, 516, 518, and 520. These flip-flops receive a control signal on their respective inputs and transmit the control signal to an associated controllable clock driver skew enable input. Typically, VLSI circuit 500 includes more flip-flops than are shown, one for each controllable clock driver present. The control signals transmitted to flip-flops 514, 516, 518, and 520 are adapted to JTAG test protocols and are transmitted through JTAG-dedicated inputs test data in (TDI) 502, test mode select (TMS) 504, and test clock (TCK) input 506.

An active signal on TMS 504 causes finite state machine 508 to enter a locate critical path (LCP) mode, wherein an LCP clock signal is transmitted on TCK input 506 to each of flip-flops 514, 516, 518, and 520 simultaneously on LCP clock input 510. TDI input 502 transmits a JTAG compatible serial signal to the data input of flip-flop 520. Flip-flop 520 transmits the serial signal to the skew enable input of controllable clock driver 522 when an active LCP clock signal is on its clock input. The serial signal is also transmitted to the input of flip-flop 518 when an active LCP clock signal is on its clock input. In this way, flip-flop 518 receives serial signals on its data input one LCP clock cycle later than flip-flop 520. Flip-flops 516 and 514 are similarly "chained" so that the serial signal propagates through flip-flops 520, 518, 516, and 514 in order as clocked by the LCP clock signal. This causes controllable clock drivers 522, 524, 526, and 528 to receive the serial signal on their respective skew enable inputs in the same order as received by their respective flip-flops.

When the JTAG compatible signal originating on TDI input 502 is active on a skew enable input of a controllable clock driver, it causes the controllable clock driver to delay its associated local block clock signal. For example, an active signal on the skew enable input of controllable clock driver 522 causes local block clock signal 530 originating from global clock signal line 512 to be delayed. Similarly, an active signal on controllable clock driver 524 causes local block clock signal 532 to be delayed. An active signal on controllable clock driver 526 causes local block clock signal 534 to be delayed. Finally, an active signal on controllable clock driver 528 causes local block clock signal 536 to be delayed.

Figure 3:
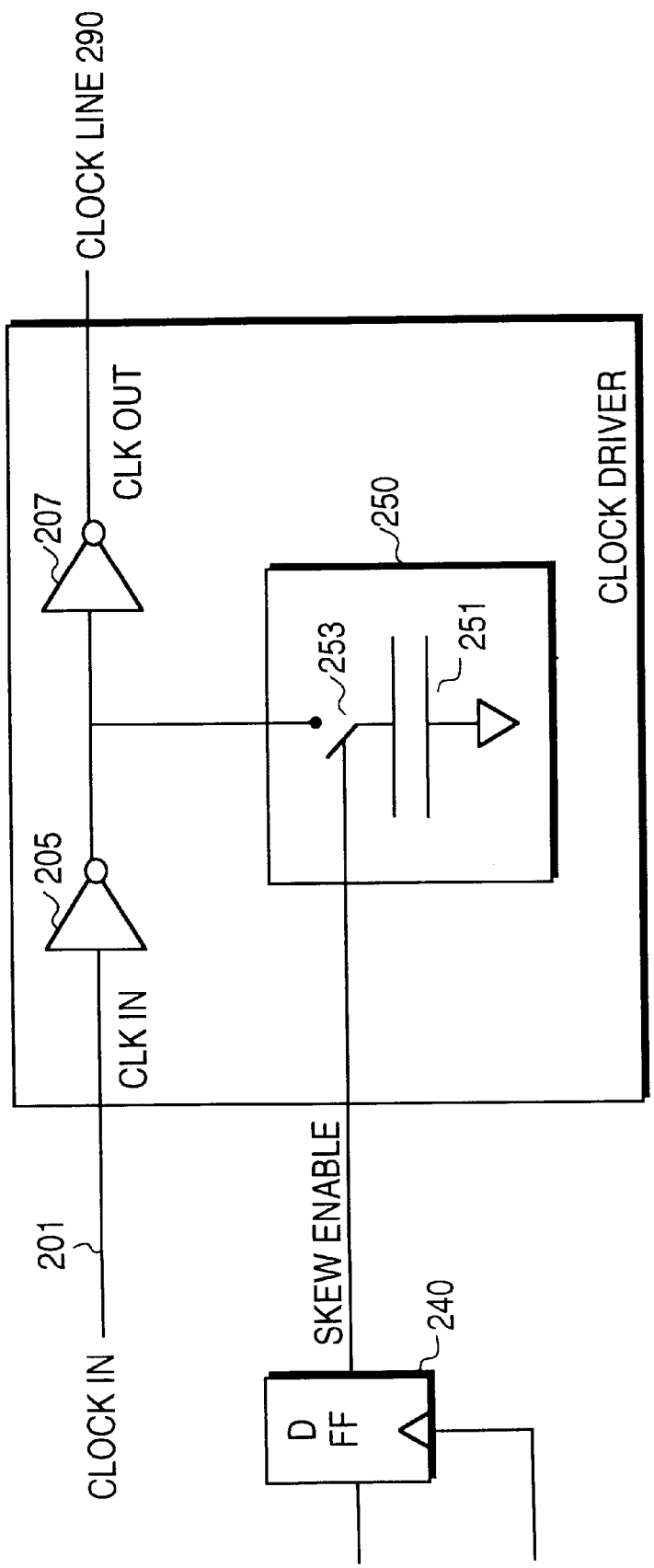
FIG. 3 is a circuit diagram of one embodiment of a controllable clock driver according to the present invention.

FIG. 3 illustrates an embodiment of a controllable clock driver for use with the present invention. The clock driver of FIG. 3 comprises two inverters 205 and 207 arranged in series. Other embodiments could include more than two inverters in series. The clock driver of FIG. 3 also includes a delay circuit 250. Delay circuit 250 comprises switch 253 and capacitor 251. Switch 253 is controlled by D flip-flop 240. A skew enable output of D flip flop 240 enables or disables delay circuit 250. When delay circuit 250 is disabled, the clock driver is disconnected from delay circuit 250 and operates normally. When delay circuit 250 is enabled, the signal generated by the clock driver is delayed, or skewed, by delay circuit 250. When the skew enable output of D flip-flop 240 is active, switch 253 is closed such that the line between inverters 205 and 207 is connected through capacitor 251 to ground. When the line between inverter 205 and inverter 207 is connected through capacitor 251 to ground, additional time is required to build up charge before the signal is propagated by inverter 207. Thus, the time required for the clock driver to propagate a clock signal on clock line 290 is increased.

Figure 4:
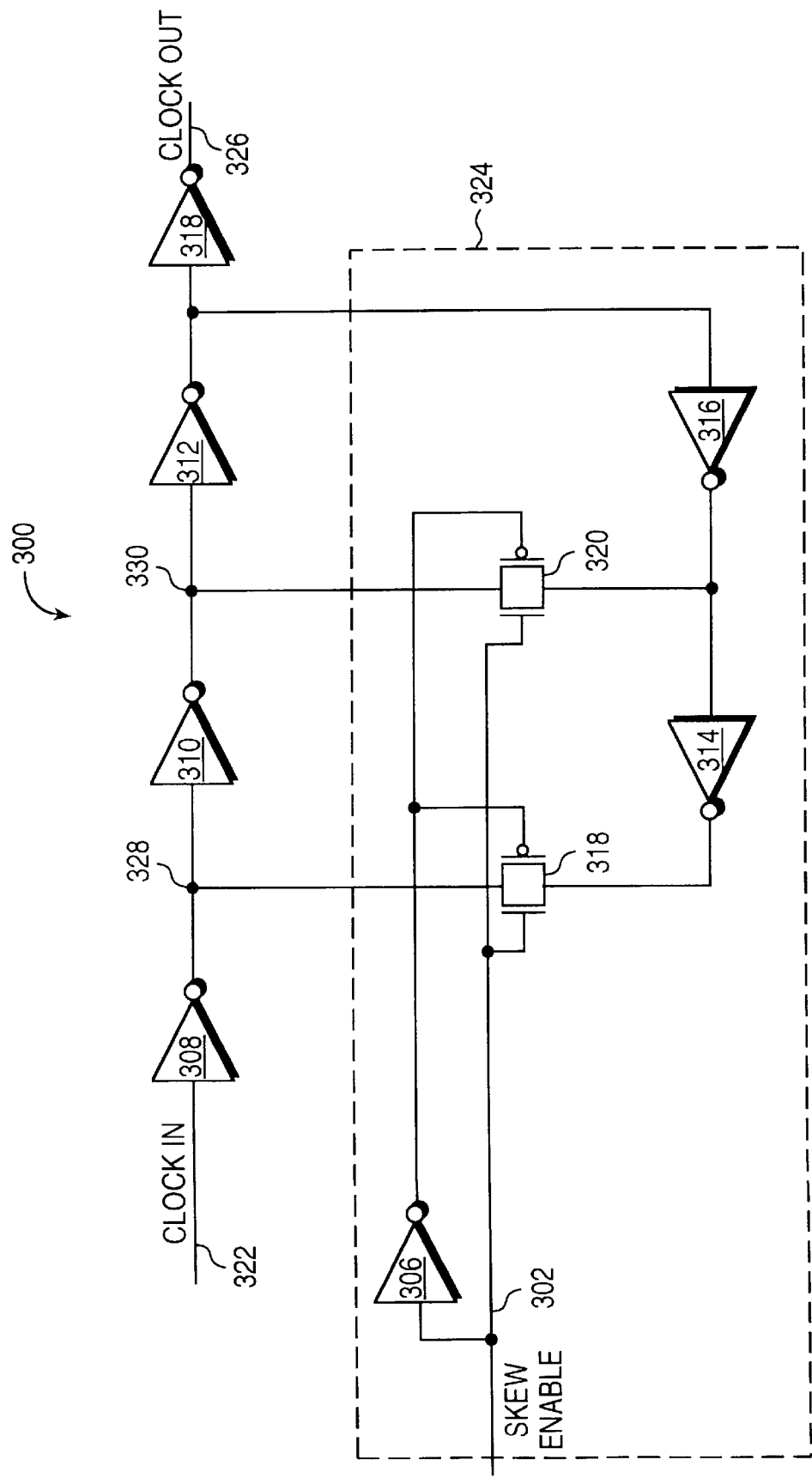
FIG. 4 is a circuit diagram of another embodiment of a controllable clock driver according to the present invention.

FIG. 4 is a circuit diagram of clock driver circuit 300, which is another embodiment of a controllable clock driver for use with the present invention. In this embodiment, signal contention is used to delay a clock signal. A clock signal is input to circuit 300 on line 322. As will be shown, when skew enable input 302 is inactive, delay circuit 324 has no effect on the remainder of clock driver circuit 300. Therefore, when skew enable input 302 is inactive, the clock signal on line 322 passes through inverters 308, 310, 312 and 318 and appears on clock out line 326. When skew enable input 302 is disabled, a low logic value appears on the n-type transistors of pass gates 318 and 320. In addition, an inactive skew enable signal is inverted by inverter 306 and appears as a high logic value on the p-type transistors of pass gates 318 and 320. In this way, pass gates 318 and 320 are turned off by an inactive signal on skew enable input 302. When pass gates 318 and 320 are turned off, signals on the outputs of inverters 314 and 316 are not passed to nodes 328 and 330. Therefore, an inactive skew enable input isolates delay circuit 324 from the remainder of clock driver circuit 300.

When skew enable input 302 is active, a high logic value appears on the n-type transistors of pass gates 318 and 320. In addition, a low logic value appears on the p-type transistors of pass gates 318 and 320. Pass gates 318 and 320 are thus turned on, allowing signals on the outputs of inverters 314 and 316 to pass to nodes 328 and 330. This produces a situation in which inverters 308 and 314 contend to drive inverter 310 and inverters 310 and 316 contend to drive inverter 312. For example, when a high logic value appears on node 328, it is inverted by inverter 310 and appears on node 330 as a low logic value. The low logic value on node 330 passes through pass gate 320, is inverted by inverter 314, passes through pass gate 318 and appears as a high logic level at node 328. Inverters 310 and 314 introduce gate delays that slow the propagation of signals passing through them. For this reason, when the logic value on node 328 changes due to a new signal originating from clock input line 322, inverter 314 will still be attempting to drive a previous logic value of the opposite sense with respect to the new signal onto node 328. For the time it takes the new logic value to propagate through inverters 310 and 314, there will be contention at node 328. The contention is eventually resolved because inverter 308 is designed to have more driving capability than inverter 314, which drives signals through pass gate 318. Contention at node 330 is introduced and resolved in a similar manner to the contention at node 328. The length of delay to the clock signal in this embodiment is on the order of tenths of picoseconds. Small adjustments to the operation of delay circuit 324 can be made by adjusting the sizes of n-type and p-type transistor making up inverters 310, 312, 318 and 320.

A method of locating critical speed paths of a VLSI circuit according to the present invention will now be explained. The operating frequency of the circuit is increased through increasing the frequency of the global clock signal. Eventually, the circuit will fail (i.e., logic errors will appear). At this point the limits of the critical speed path have been exceeded.

The skew enable for one controllable clock driver in the circuit is then enabled. The local block clock associated with the controllable clock driver is thus slowed. Each controllable clock driver skew enable associated with a local block clock must be enabled in turn until the logic error disappears. When the logic error disappears, the local block containing the receiving flip-flop of the critical path has been located.

Next, the local block containing the source flip-flop for the critical path must be found. Keeping the skew enable of the receiving clock driver active, skew enables for clock drivers driving local block clocks which contain circuitry sending signals to the receiving block are enabled in turn. When the error reappears, the sending local block of the critical path has been found.

According to the present invention, the serial signal on TDI input 502 is a test vector designed to skew local block clocks in a predetermined order. The progression of active skew enable signals through controllable clock drivers of the VLSI circuit is timed by the LCP clock signal on LCP clock line 510. Using data collected during the test process described above, it is then possible to identify sending and receiving local blocks of the critical path of the VLSI circuit. Each local block contains circuitry capable of receiving and/or sending many signals. Therefore, after determining a receiving and sending local block of the critical path, well known circuit design and testing tools are used to reduce the number of possible flip-flops in a local block that may be in the critical path.

To facilitate the design of complex integrated circuits many computeraided design tools are used. The computer-aided design tools store information that define every aspect of the designed integrated circuit. For example, a connection database contains information identifying all the connections between various flip-flops. The information in this database can be used in conjunction with the present invention to help locate a critical speed path within a VLSI circuit.

After localizing the area that contains the critical speed path as existing between particular clock drivers, both the source clock driver that clocks the source of the critical speed path and a destination clock driver that clocks the destination of the critical speed path are known. The connection database is then searched to locate all data paths that originate at a flip-flop clocked by the source clock driver and terminate at a flip-flop clocked by the destination clock driver. These are the only possible critical speed paths.

For example, referring to FIG. 1 suppose that a critical speed path has been localized such that it is known to originate in a flip-flop clocked by clock driver 100 and to terminate in a flip-flop clocked by clock driver 130. By examining the connection database, it can be determined that the critical speed path must be data path 185, data path 187, data path 188, or data path 189 since those are the only data paths that connect source flip-flops clocked by clock driver 100 to destination flip-flops clocked by clock driver 130.

After decreasing the number of possible critical speed paths by using the connection database, another design tool is then used to further decrease the number of possible critical speed paths. Specifically, a logic simulation trace is examined.

When designing a complex integrated circuit, the entire integrated circuit is simulated on a computer before it is committed to silicon. The integrated circuit is simulated such that the output of every flip-flop during every clock cycle is known. FIG. 4 illustrates an example of some information from a logic simulation. In FIG. 4, time proceeds from left to right. The rows represent the state of various flip-flops during consecutive clock cycles.

To help locate the critical speed path, the exact time at which the critical speed path error occurs is identified on the logic simulation trace. In the example of FIG. 4, the critical speed path error occurs after clock cycle $\Phi+5$.

Errors related to critical speed path occur when the source flip-flop changes its output before it has been sampled properly by the destination flip-flop. Thus, only those source flip-flops that change state at the time the error occurred can be related to the critical speed path. Therefore, all data paths that do not include a changing source flip-flop are excluded from possibility.

In FIG. 4, between clock cycle $\Phi+5$ and clock cycle $\Phi+6$, only flip-flop 4 and flip-flop 7 change state. Assuming that the source clock driver is clock driver 100 and the destination clock driver is clock driver 130, data path 173 coupled to flip-flop 4 cannot be the critical speed path. This is because data path 173 does not connect to a destination flip-flop clocked by destination clock driver 130. The critical speed path must therefore be data path 187 because it originates from a flip-flop clocked by the source clock driver, it terminates at a flip-flop clocked by the destination clock driver, and it is the only one of such data paths whose source flip-flip changed state when the error occurred.

The methods of the present invention do not yield exactly one possible critical speed path in every case, but do reduce the number of possible critical speed paths to a small number much more quickly and easily than prior methods. It is feasible to redesign such a small number of paths to eliminate the errors exposed in testing.

Although the present invention has been described in terms of specific exemplary embodiments, it will be appreciated that various modifications and alterations might be made by those skilled in the art without departing from the spirit and scope of the invention as set forth in the following claims.

What is claimed is:

1. An apparatus for testing an integrated circuit, comprising:

a plurality of controllable clock drivers each providing a clock signal at an output to an associated circuit block of the integrated circuit, each controllable clock driver also having an input coupled to receive a global clock signal, and a skew enable input, an active signal transmitted on the skew enable input causing the controllable clock driver to delay the clock signal provided at the output, and wherein each controllable clock driver includes a pair of inverters coupled in series between the input and the output, and a delay element coupled to the pair of inverters to delay signal propagation between the input and the output when enabled by the active signal of the skew enable input;

a plurality of clocked storage devices each coupled to one of the controllable clock drivers and including a clock input, a data input and a data output; and test circuitry that operates with a joint test action group (JTAG) compatible protocol coupled to the plurality of clocked storage devices and generating a signal that controls the plurality of controllable clock drivers.

2. The apparatus of claim 1, wherein the test circuitry further comprises:

a test data input (TDI) coupled to a data input of a first clocked storage device of the plurality of clocked storage devices;

a finite state machine that generates a locate critical path (LCP) clock signal and transmits the LCP clock signal to a clock input of each of the plurality of clocked storage devices;

a test clock signal (TCS) input coupled to transmit a test clock signal to the finite state machine; and a test mode select (TMS) input coupled to the finite state machine.

3. The apparatus of claim 2, wherein a specific serial pattern on the TMS input causes the finite state machine to enter an LCP mode.

4. The apparatus of claim 3, wherein in the LCP mode, a predetermined serial pattern is transmitted on the TDI input to the data input of the first clocked storage device and wherein the first clocked storage device is coupled in series to the plurality of clocked storage devices through a data output of the first clocked storage device coupled to a data input of a next clocked storage device in the series.

5. The apparatus of claim 4, wherein the delay element comprises:

a switch having a first terminal coupled to the pair of inverters and a second terminal, the switch being controlled by the skew enable input such that when the active signal is provided on the skew enable input the switch is closed and the first and second terminals are connected; and a capacitor coupled between the second terminal and ground.

6. A method for locating a critical speed path in a very large scale integration (VLSI) integrated circuit using a joint test action group (JTAG) circuitry, comprising the steps of:

a) increasing the operating frequency of the integrated circuit until a logic error occurs due to a sampling device in a first subblock sampling a signal before a change of state of the signal has propagated from a source device in a second subblock; and b) inputting a particular serial signal on a test data in (TDI) input of the JTAG circuitry, the serial signal separately controlling each of a plurality of clock signals associated with different circuit blocks of the integrated circuit, the serial signal increasing a propagation time of a first clock signal supplying the first circuit subblock of the integrated circuit containing the sampling device; and c) if the error is not eliminated, increasing a propagation time of a next clock signal supplying the first circuit subblock of the integrated circuit containing the sampling device until the error is eliminated.

7. The method of claim 6, further comprising the step of d) after increasing the propagation time of a clock signal supplying the first circuit subblock such that the logic error is eliminated, increasing a propagation time of a second clock signal supplying a second circuit subblock of the integrated circuit containing the source device until the logic error reoccurs in the integrated circuit.

8. The method of claim 7 further comprising the step of d) examining a connection database to locate a set of data paths each originating from the second circuit subblock and terminating in the first circuit subblock.

9. The method of claim 8, further comprising the steps of:

e) performing a logic simulation of the integrated circuit to detect logic errors; and f) examining graphical output of the logic simulation to identify at least one device of the first or second circuit subblocks that changed state during a clock cycle in which a logic error occurred.

* * * * *

UNITED STATES PATENT AND TRADEMARK OFFICE
CERTIFICATE OF CORRECTION

PATENT NO. : 6,052,811
DATED : April 18, 2000
INVENTOR(S) : Ashuri

It is certified that error appears in the above-identified patent and that said Letters Patent is hereby corrected as shown below:

On the Title Page At [75] replace inventor "Roni Ahsuri" with --Roni Ashuri--.

Signed and Sealed this

Seventeenth Day of April, 2001

Attest:

NICHOLAS P. GODICI

*Attesting Officer*     *Acting Director of the United States Patent and Trademark Office*